US012570519B2

(12) United States Patent
Guo et al.

(10) Patent No.: US 12,570,519 B2
(45) Date of Patent: Mar. 10, 2026

(54) MEMS DEVICE, METHOD FOR MANUFACTURING MEMS DEVICE AND ELECTRONIC DEVICE

(71) Applicants:Beijing BOE Technology Development Co., Ltd., Beijing (CN); BOE TECHNOLOGY GROUP CO., LTD., Beijing (CN)

(72) Inventors: Jingwen Guo, Beijing (CN); Jianxing Liu, Beijing (CN); Jianyun Zhao, Beijing (CN); Biqi Li, Beijing (CN)

(73) Assignees: Beijing BOE Technology Development Co., Ltd., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 491 days.

(21) Appl. No.: 18/021,582

(22) PCT Filed: May 27, 2022

(86) PCT No.: PCT/CN2022/095434
§ 371 (c)(1),
(2) Date: Feb. 16, 2023

(87) PCT Pub. No.: WO2023/225978
PCT Pub. Date: Nov. 30, 2023

(65) Prior Publication Data
US 2024/0262678 A1 Aug. 8, 2024

(51) Int. Cl.
B81B 3/00 (2006.01)
B81C 1/00 (2006.01)
(52) U.S. Cl.
CPC ........ B81B 3/0008 (2013.01); B81C 1/00984 (2013.01); B81B 2201/01 (2013.01);
(Continued)

(58) Field of Classification Search
CPC . B81B 3/0008; B81B 3/001; B81B 2201/016; B81C 1/00984; H04R 19/04
See application file for complete search history.

(56) References Cited

U.S. PATENT DOCUMENTS 8,387,464 B2 * 3/2013 McNeil ..................... B81B 7/02
73/777
2011/0241137 A1 * 10/2011 Huang ................... H10D 84/40
257/419
(Continued)

FOREIGN PATENT DOCUMENTS

CN 101203066 A 6/2008
CN 103281661 A 9/2013
(Continued)

OTHER PUBLICATIONS

Brault et al., "MEMS packaging process by film transfer using anti-sticking layer," Conference Paper, May 12, 2009; 2009 Symposium on Design, Test, Integration & Packaging of MEMS/MOEMS.
(Continued)

*Primary Examiner* — Moazzam Hossain
(74) *Attorney, Agent, or Firm* — HOUTTEMAN LAW LLC

(57) ABSTRACT

The present disclosure provides an MEMS device, a method for manufacturing an MEMS device and an electronic device, and belongs to the field of Micro-Electro-Mechanical System technology. The MEMS device includes: a first dielectric substrate and a first component on the first dielectric substrate; the first component and the first dielectric substrate enclose a movable space; the first component has a first portion corresponding to the movable space; the first portion has at least one first opening, and at least one protruding structure is on a side of the first portion close to the first dielectric substrate; orthographic projections of the (Continued)

at least one protruding structure and the at least one first opening on the first dielectric substrate do not overlap with each other, and a thickness of each protruding structure is smaller than a height of the movable space.

14 Claims, 9 Drawing Sheets

(52) U.S. Cl.
CPC ................ *B81B 2203/0109* (2013.01); *B81B 2203/0118* (2013.01); *B81B 2203/0127* (2013.01); *B81B 2203/0323* (2013.01); *B81B 2203/04* (2013.01); *B81B 2207/99* (2013.01); *B81C 2201/0109* (2013.01); *B81C 2201/0132* (2013.01)

(56) References Cited

U.S. PATENT DOCUMENTS

| | | | |
|---|---|---|---|
| 2014/0175572 A1* | 6/2014 | Hsu ........................ | G01P 15/125 |
| | | | 257/415 |
| 2014/0270271 A1 | 9/2014 | Dehe et al. | |
| 2019/0116427 A1* | 4/2019 | Inoue .................... | B81B 3/0072 |
| 2020/0245053 A1 | 7/2020 | Pedersen et al. | |
| 2021/0002128 A1* | 1/2021 | Cok ........................ | H10N 30/02 |
| 2021/0061651 A1* | 3/2021 | Gotoh ................ | B81C 1/00158 |
| 2023/0179928 A1* | 6/2023 | Jung ........................ | B81B 3/007 |
| | | | 381/174 |
| 2023/0345185 A1* | 10/2023 | Lee .......................... | H04R 7/18 |
| 2023/0382714 A1* | 11/2023 | Jung .................... | B81B 3/0021 |

FOREIGN PATENT DOCUMENTS

| | | | |
|---|---|---|---|
| CN | 103569942 A | 2/2014 | |
| CN | 104053104 A | 9/2014 | |
| CN | 203998936 U | 12/2014 | |
| CN | 104507014 A | 4/2015 | |
| CN | 104918169 A | 9/2015 | |
| CN | 105357617 A | 2/2016 | |
| CN | 205283814 U | 6/2016 | |
| CN | 205442630 U | 8/2016 | |
| CN | 207911007 U | 9/2018 | |
| CN | 108622843 A | 10/2018 | |
| CN | 211047213 U | 7/2020 | |
| CN | 211959452 U | 11/2020 | |
| CN | 112340692 A | 2/2021 | |
| CN | 112492474 A | 3/2021 | |
| CN | 112492487 A | 3/2021 | |
| CN | 213661943 U | 7/2021 | |
| CN | 213694153 U | 7/2021 | |
| CN | 113460952 A | 10/2021 | |
| CN | 113912000 A | 1/2022 | |
| JP | 2011239324 A | 11/2011 | |
| JP | 2012040619 A | 3/2012 | |

OTHER PUBLICATIONS

Zhibo MA, "Research on MEMS Micro Deformable Mirror Testing and Process Anti adhesion Technology," Master's Theses, Jun. 15, 2007, N.W. Polytech. Univ., Xi'an China. English Abstract.

* cited by examiner

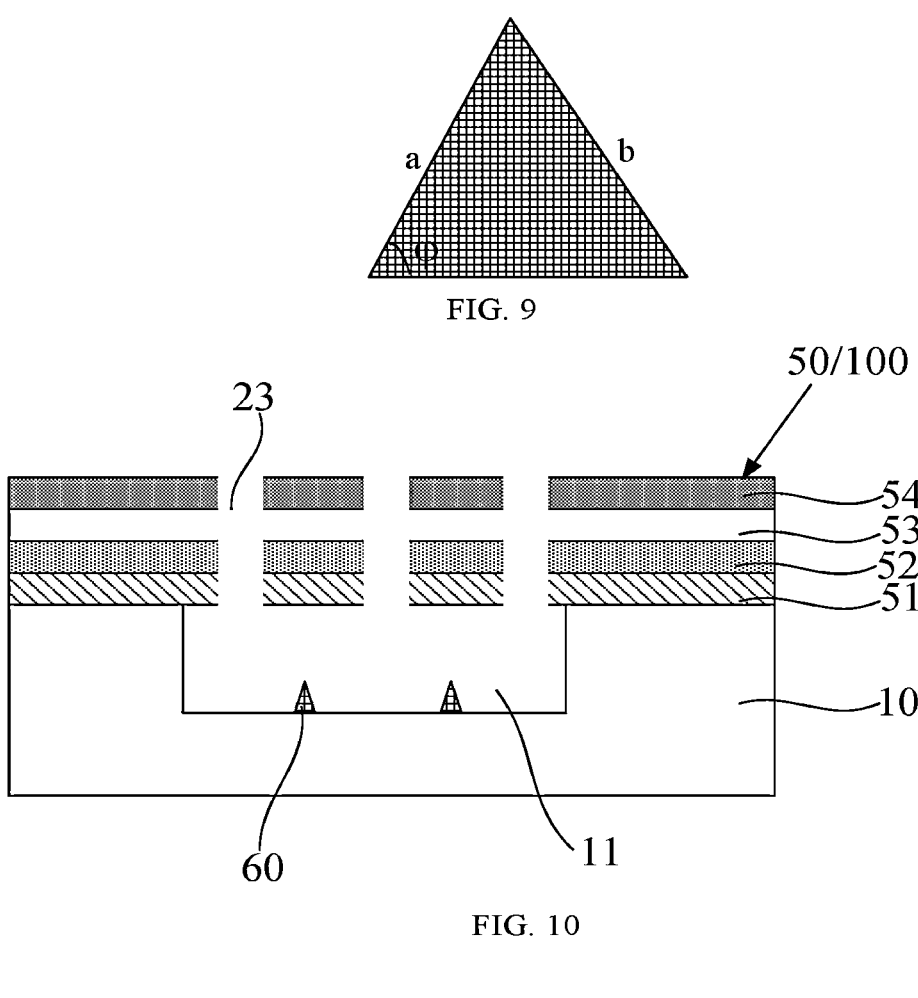
FIG. 9
FIG. 10
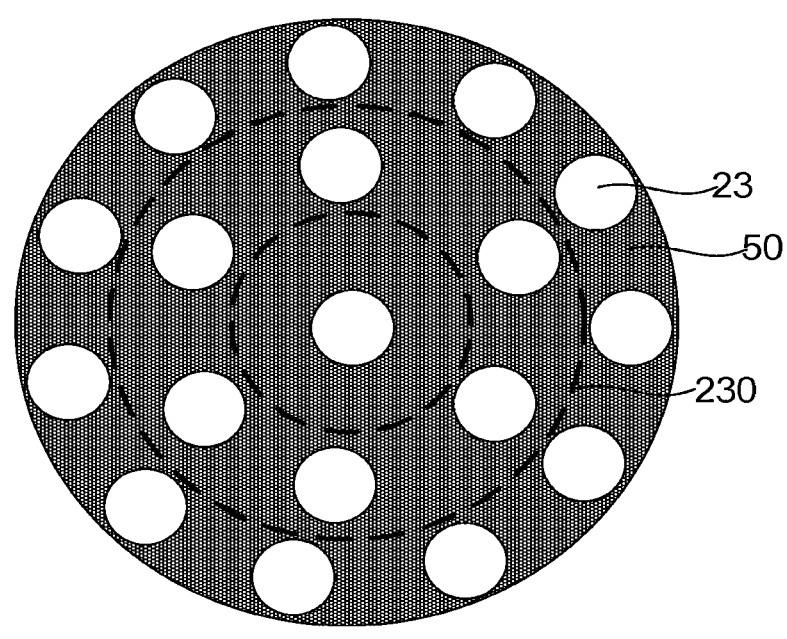
FIG. 11

MEMS DEVICE, METHOD FOR MANUFACTURING MEMS DEVICE AND ELECTRONIC DEVICE

TECHNICAL FIELD

The present disclosure relates to the field of Micro-Electro-Mechanical System (MEMS) technology, and in particular to an MEMS device, a method for manufacturing an MEMS device and an electronic device.

BACKGROUND

A micro-electro-mechanical system (MEMS) is a micro device or system integrated with a micro sensor, a micro actuator, a micro mechanical structure, a micro power source, a micro energy source, a signal processing and control circuit, an electronic integrated device having a high performance, an interface, and communication and the like. The MEMS is a revolutionary new technology, is widely applied to the high and new technology industry, and is a key technology related to the national science and technology development, the economic prosperity and the national defense safety. With the rapid development of the information age, the MEMS device with high integration, miniaturization, multifunction, and low cost will bring huge economic value.

However, most MEMS devices have a suspending and movable structure, which is necessarily driven (such as electrostatically driven, electromagnetically driven, thermally driven or the like) by applying various driving signals in specific operations. Particularly, the suspending structure driven by static electricity may generate a surface contact in the motion process, so that an adhesion effect is easily generated, and the function failure is caused. How to solve the adhesion failure of the MEMS device is a very critical problem, which is also the problem that is intended to be solved and tackled in the actual project in research at present.

SUMMARY

The present disclosure aims to solve at least one of the technical problems in the prior art, and provides an MEMS device, a method for manufacturing an MEMS device and an electronic device.

An embodiment of the present disclosure provides an MEMS device, including: a first dielectric substrate and a first component on the first dielectric substrate; the first component and the first dielectric substrate enclose a movable space; the first component has a first portion corresponding to the movable space; the first portion has at least one first opening, and at least one protruding structure is on a side of the first portion close to the first dielectric substrate; orthographic projections of the at least one protruding structure and the at least one first opening on the first dielectric substrate do not overlap with each other, and a thickness of each protruding structure is smaller than a height of the movable space.

In some embodiments, the first portion has a plurality of first openings, which are divided into a plurality of first opening groups arranged side by side along a first direction; multiple first openings in each first opening group are arranged side by side along a second direction; and sizes of the first openings in the same first opening group are equal to each other.

In some embodiments, the first portion has a plurality of first openings, which are divided into a plurality of first opening groups arranged side by side along a first direction; multiple first openings in each first opening group are arranged side by side along a second direction; and sizes of any two adjacent first openings in the same first opening group are different from each other.

In some embodiments, the first portion includes a plurality of first opening groups arranged in nested rings; first openings in each first opening group are sequentially arranged along a circumferential direction of the first opening group, and sizes of the first openings in the same first opening group are equal to each other.

In some embodiments, a size of each first opening in a first opening group is different from that of each first opening in an adjacent first opening group.

In some embodiments, the first portion includes a plurality of first opening groups arranged in nested rings; first openings in each first opening group are sequentially arranged along a circumferential direction of the first opening group; and sizes of any two adjacent first openings in the same first opening group are different from each other.

In some embodiments, a shape of the at least one protruding structure include one or more of a pyramid, a cone, a truncated pyramid, and a circular truncated cone, or a combination thereof.

In some embodiments, a shape of the at least one first opening includes one or more of a circle, an ellipse and a polygon, or a combination thereof.

In some embodiments, the at least one protruding structure is on the first dielectric substrate; and there is a distance between the at least one protruding structure and the first portion.

In some embodiments, a material of the at least one protruding structure includes an inorganic material.

In some embodiments, the at least one protruding structure is on the first portion; and there is a distance between the at least one protruding structure and the first dielectric substrate.

In some embodiments, a material of the at least one protruding structure includes an organic material.

In some embodiments, the first component includes a bridge floor structure and at least one connecting arm; the bridge floor structure is fixed with the first dielectric substrate through the at least one connecting arm, and the bridge floor structure is used as the first portion; the MEMS device further includes a driving electrode on the first dielectric substrate and an interlayer insulating layer covering the driving electrode; the bridge floor structure spans across the driving electrode; and the bridge floor structure has a distance from the interlayer insulating layer covering the driving electrode.

In some embodiments, the first dielectric substrate has a first groove portion therein; the first portion and the first groove portion form the movable space; and the first component includes an elastic layer, a first electrode layer, a piezoelectric layer and a second electrode layer which are sequentially arranged on the first dielectric substrate.

The embodiment of the present disclosure provides a method for manufacturing the above MEMS device, including: forming a sacrificial layer on a side of the first dielectric substrate; forming a first component on a side of the sacrificial layer away from the first dielectric substrate, the first portion of the first component is provided with at least one first opening therein; the first component and the first dielectric substrate enclose the movable space; and etching the sacrificial layer by adopting dry etching to form the at least one protruding structure on a side of the first portion close to the first dielectric substrate; the orthographic projections of the at least one protruding structure and the at least one first opening on the first dielectric substrate do not overlap with each other, and the thickness of each protruding structure is smaller than the height of the movable space.

The embodiment of the present disclosure provides an electronic device, which includes the MEMS device described above.

BRIEF DESCRIPTION OF DRAWINGS

FIG. 9 is a cross-sectional view of an MEMS device with a protruding structure perpendicular to a first dielectric substrate in a first example of an embodiment of the present disclosure.

FIG. 10 is a schematic diagram of an MEMS device as a vibrating device in a first example of an embodiment of the present disclosure.

FIG. 11 is a top view of a first component of an MEMS device as a vibrating device in a first example of an embodiment of the present disclosure.

DETAIL DESCRIPTION OF EMBODIMENTS

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

A micro-electro-mechanical system (MEMS), also known as a micro electro mechanical system, a micro system, a micro machine or the like, refers to a high-tech device having dimensions of a few millimeters or less. The MEMS device in embodiments of the present disclosure may be any MEMS-based device. For example, the MEMS device may be used for radio frequency RF switches, probe detection and resonant beams. The MEMS device is also applicable to a circular vibrating diaphragm 50 or a polygonal vibrating diaphragm 50, or other designs and applications for micro structures, including, but not limited to, an accelerometer, an angular velocity meter, a tiny microphone, a micro electro mechanical interference display, a micro electro mechanical capacitive ultrasonic transducer, a micro mirror, or the like.

Figure 1:
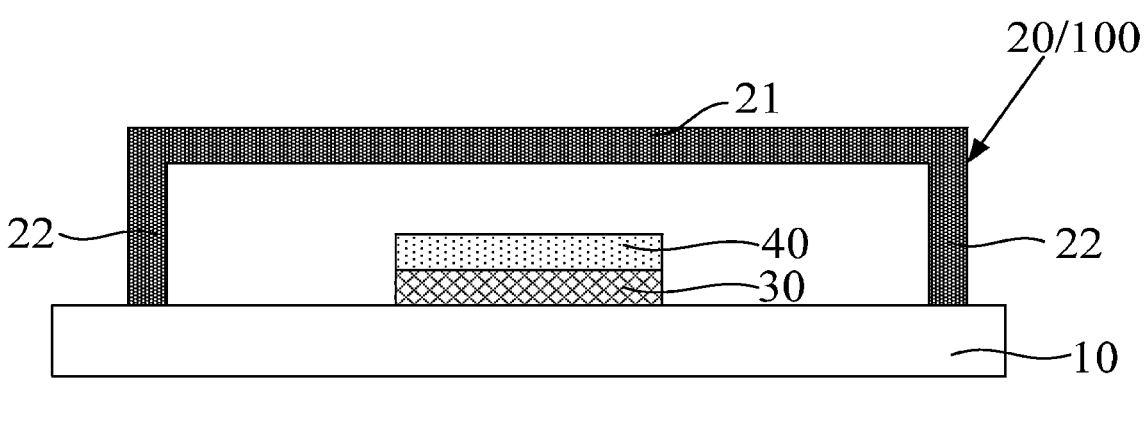
FIG. 1 is a schematic diagram of an exemplary MEMS device as a switching device in an on state.
Figure 2:
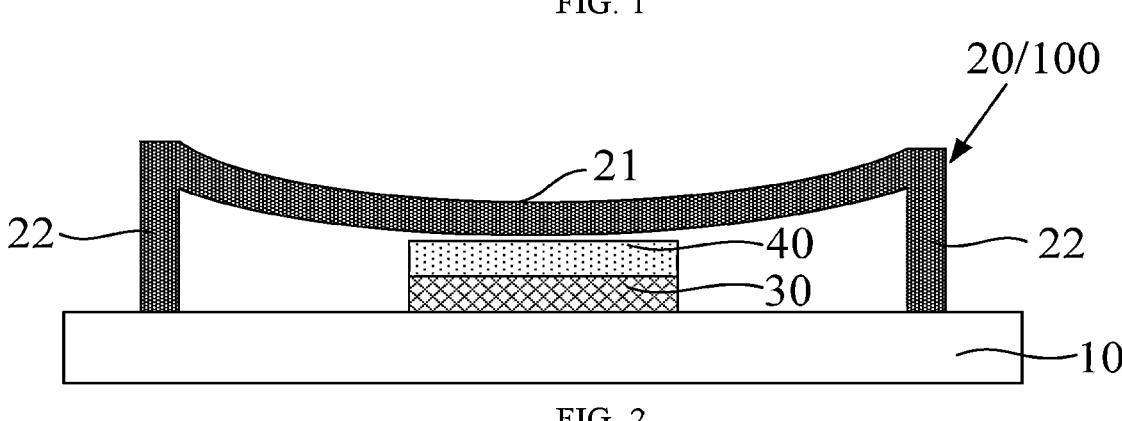
FIG. 2 is a schematic diagram of an exemplary MEMS device as a switching device in an off state.

The MEMS device may be used as a switching device. FIG. 1 is a schematic diagram of an exemplary MEMS device as a switching device in an on state. FIG. 2 is a schematic diagram of an exemplary MEMS device as a switching device in an off state. As shown in FIGS. 1 and 2, the MEMS device includes a first dielectric substrate 10, a driving electrode 30 disposed on the first dielectric substrate 10, an interlayer insulating layer 40 covering the driving electrode 30, and a first component 100 disposed over the interlayer insulating layer 40. The first component 100 is a film-bridge 20, and the film-bridge 20 includes a bridge floor structure 21 and connecting arms 22 connected to both ends of the bridge floor structure 21. The bridge floor structure 21 of the film-bridge 20 spans across the driving electrode with a distance between the bridge floor structure 21 and the interlayer insulating layer 40 above the driving electrode 30. That is, the film-bridge 20 and the first dielectric substrate 10 enclose a movable space. When a certain voltage is applied to the driving electrode 30 and the film-bridge 20, the bridge floor structure 21 of the film-bridge 20 will move towards the driving electrode 30 under the action of the electrostatic force, thereby achieving an off state of the switch. When the voltage on the driving electrode 30 and the film-bridge 20 is removed, the film-bridge 20 will return to the original position, and the switch is in an on state.

Figure 3:
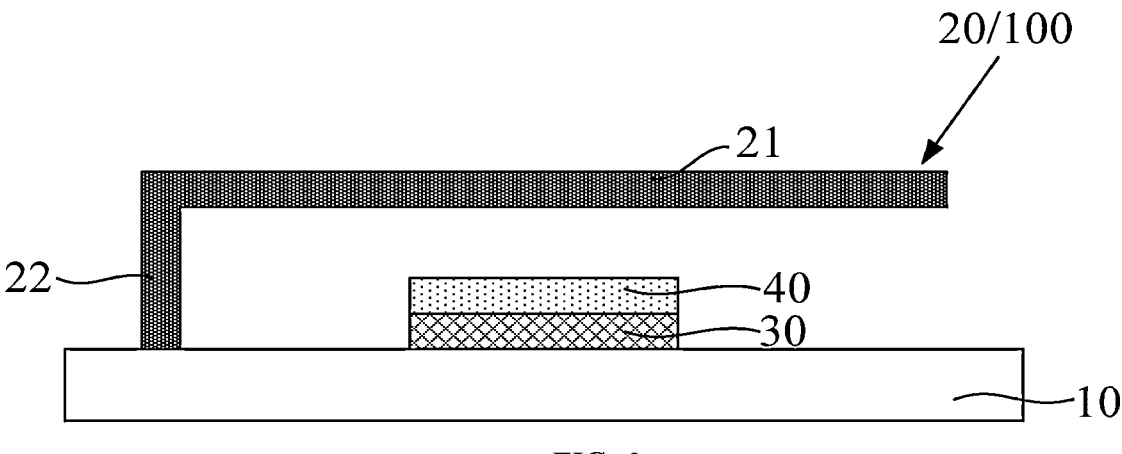
FIG. 3 is a schematic diagram of an exemplary MEMS device as a switching device in an on state.
Figures 4, 5, 6:
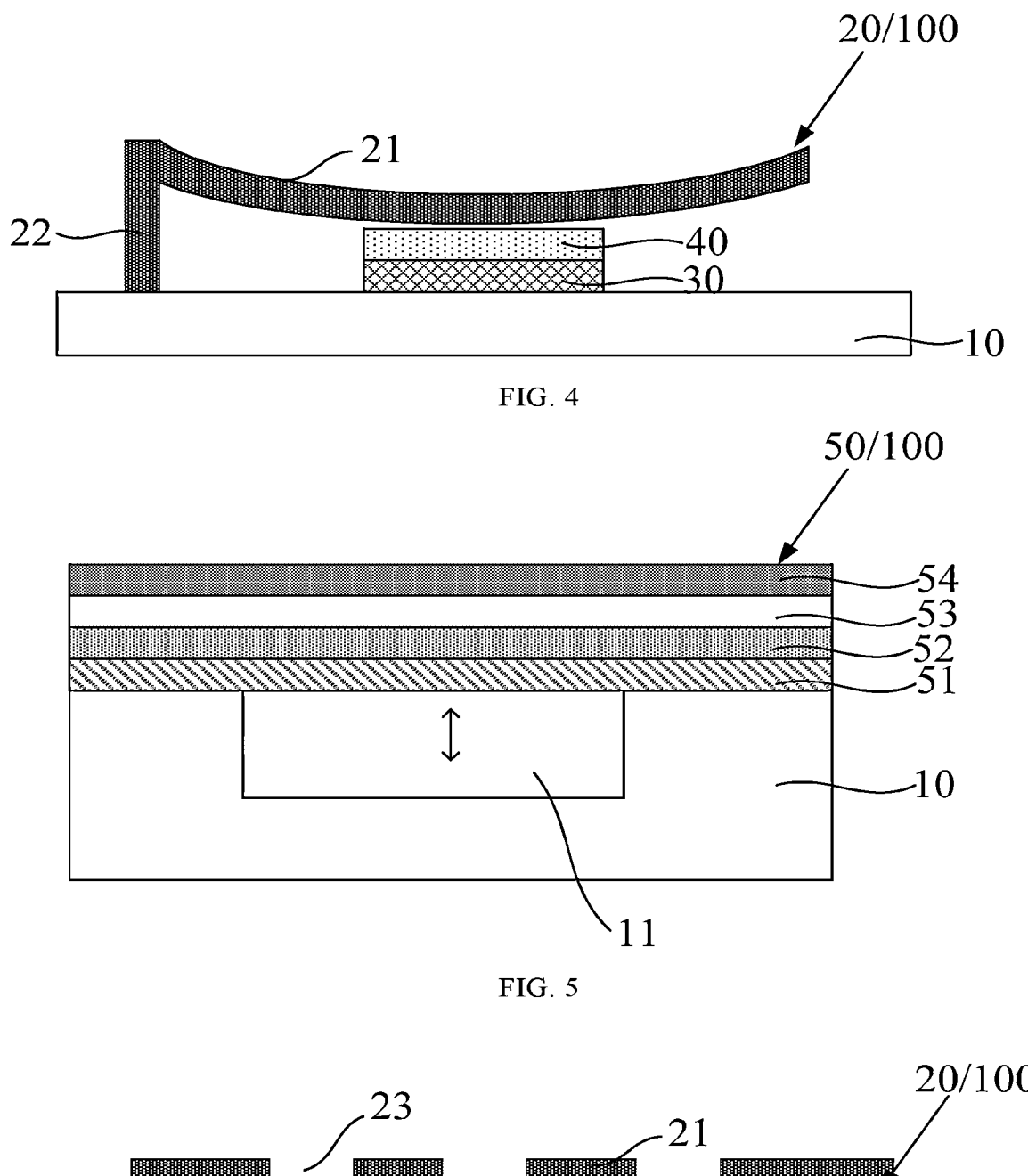
FIG. 4 is a schematic diagram of an exemplary MEMS device as a switching device in an off state.
FIG. 5 is a schematic diagram of an exemplary MEMS device as a vibrating device.
FIG. 6 is a schematic diagram of an MEMS device as a switching device in a first example of an embodiment of the present disclosure.

It should be noted that, FIGS. 1 and 2 show an MEMS switch with a double-arm fixed beam structure. Alternatively, the MEMS switch may include only one connecting arm 22, that is, the MEMS switch has a cantilever beam structure. FIG. 3 is a schematic diagram of an exemplary MEMS device as a switching device in an on state. FIG. 4 is a schematic diagram of an exemplary MEMS device as a switching device in an off state. As shown in FIGS. 3 and 4, the operation principle of the switch is the same as that of the above MEMS switch with the double-arm fixed beam structure, and therefore, the description thereof will not be repeated.

The MEMS device may also be used as a vibrating device, such as an ultrasonic transducer. FIG. 5 is a schematic diagram of an exemplary MEMS device as a vibrating device. As shown in FIG. 5, the MEMS device includes a first dielectric substrate 10; the first dielectric substrate 10 has a first groove portion therein; layers of the first component 100 are successively disposed on the first dielectric substrate 10, including an elastic layer 51, a first electrode layer 52, a piezoelectric layer 53, and a second electrode layer 54, which are sequentially disposed. By applying voltages to the first electrode layer 52 and the second electrode layer 54, the first component 100 vibrates at the position of the first groove portion.

The inventor finds that in the above several exemplary MEMS devices, the first component 100 is displaced toward or away from a bottom surface of the first dielectric substrate 10 under certain conditions, so that when the first component 100 moves toward the bottom surface of the first dielectric substrate 10, there is a high possibility that the first component adheres to layers on the first dielectric substrate 10.

In view of the above problems, the embodiment of the present disclosure provides a novel MEMS device and a method for manufacturing the same.

The embodiment of the present disclosure provides an MEMS device and a method for manufacturing an MEMS device. The MEMS device includes a first dielectric substrate 10 and a first component 100 arranged on the first dielectric substrate 10, the first component 100 and the first dielectric substrate 10 enclose a movable space; the first component 100 has a first portion corresponding to the movable space; the first portion has at least one first opening 23, and at least one protruding structure 60 is arranged on a side of the first portion close to the first dielectric substrate 10; orthographic projections of the at least one protruding structure 60 and the at least one first opening 23 on the first dielectric substrate 10 do not overlap with each other, and a thickness of each protruding structure 60 is smaller than a height of the movable space.

The at least one protruding structure 60 is located on a side of the first portion of the first component 100 close to the first dielectric substrate 10. In some examples, the at least one protruding structure 60 may be located on the first component 100 and directly contact with the first portion of the first component 100. In some examples, alternatively, the at least one protruding structure 60 may be located on the first dielectric substrate 10. In this case, the at least one protruding structure 60 may be located on the first dielectric substrate 10 and directly contact with the first dielectric substrate 10. With respect to the above exemplary specific arrangement of the at least one protruding structure 60, the reasons will be given in the following description.

In the MEMS device according to the embodiment of the present disclosure, the at least one protruding structure 60 is disposed on a side of the first component 100 close to the first dielectric substrate 10, so that when the first component 100 moves towards the first dielectric substrate 10, the at least one protruding structure 60 can effectively prevent the first component 100 from adhering to layers on the first dielectric substrate 10 after being pulled down. In addition, since the at least one first opening 23 is formed in the first component 100, a sacrificial layer 600 may be dry etched by using the first component 100 as a mask to form the at least one protruding structure 60 on the side of the first component 100 close to the first dielectric substrate 10. The at least one protruding structure 60 is formed in this way, so that the process is simple. In addition, the first component 100 is used as the mask, which can save cost.

The MEMS device in the embodiment of the present disclosure may be obtained by forming the at least one protruding structure 60 and forming the at least one first opening 23 in the first component 100 based on any one of the devices shown in FIGS. 1 to 3. Alternatively, the MEMS device in the embodiments of the present disclosure may also be applied in the probe detection, the resonant beams. The MEMS device is also applicable to a circular vibrating diaphragm 50 or a polygonal vibrating diaphragm 50, or other designs and applications for micro structures, including, but not limited to, an accelerometer, an angular velocity meter, a tiny microphone, a micro-electro-mechanical interference display, a micro-electro-mechanical capacitive ultrasonic transducer, a micro mirror, or the like. In the following description, as an example, the MEMS device is a switching device including a dual-arm fixed beam structure and a device including the circular diaphragm 50 for description, which should be understood to not limit the scope of the embodiments of the present disclosure.

In the embodiment of the present disclosure, no matter which of the above device designs the MEMS device is applied to, a shape of each protruding structure 60 depends on a shape and a size of each first opening 23 in the first portion, and a position where each protruding structure 60 is formed depends on a material selected for forming the protruding structure 60. The structure of the MEMS device and the corresponding method for manufacturing an MEMS device in the embodiments of the present disclosure are specifically described with reference to examples.

Figure 7:
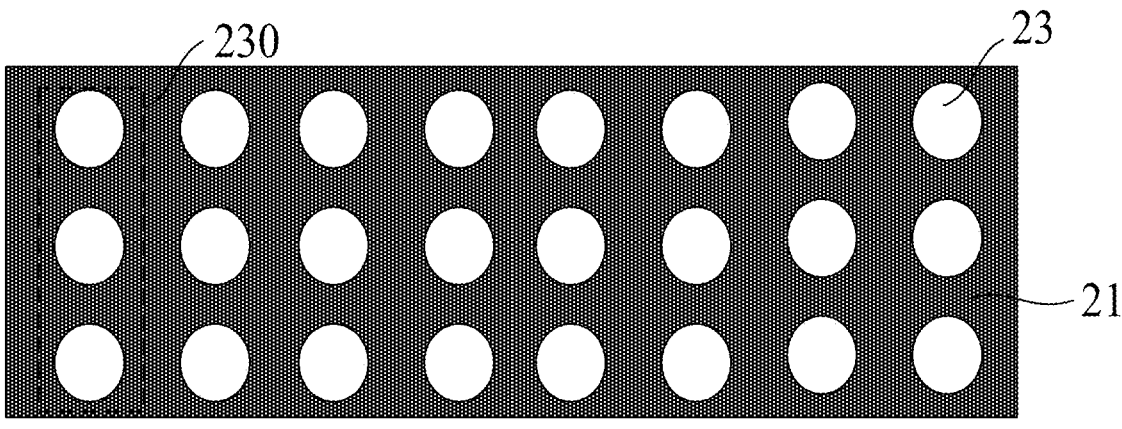
FIG. 7 is a top view of a first component of an MEMS device as a switching device in a first example of an embodiment of the present disclosure.

A first example is as follows: FIG. 6 is a schematic diagram of an MEMS device as a switching device in a first example of an embodiment of the present disclosure. FIG. 7 is a top view of a first component 100 of an MEMS device as a switching device in a first example of an embodiment of the present disclosure. As shown in FIGS. 6 and 7, the MEMS device is an MEMS switch, the first component 100 serves as the film-bridge 20. The first portion of the first component 100 is used as the bridge floor structure 21 of the film-bridge 20; a contour of the bridge floor structure 21 of the film-bridge 20 is rectangular; each first opening 23 in the bridge floor structure 21 is circular; the at least one first opening 23 includes a plurality of first openings 23; the plurality of first openings 23 are divided into first opening groups 230 arranged side by side along a first direction, and the first openings 23 in each first opening group 230 are the same size. For example, the first openings 23 in the first portion are arranged in an array, and the sizes of the first openings 23 are all equal to each other. The at least one protruding structure 60 is formed on the first dielectric substrate 10. A shape of a cross section of each protruding structure 60 (in a plane) perpendicular to the first dielectric substrate 10 is an isosceles triangle.

Figure 8:
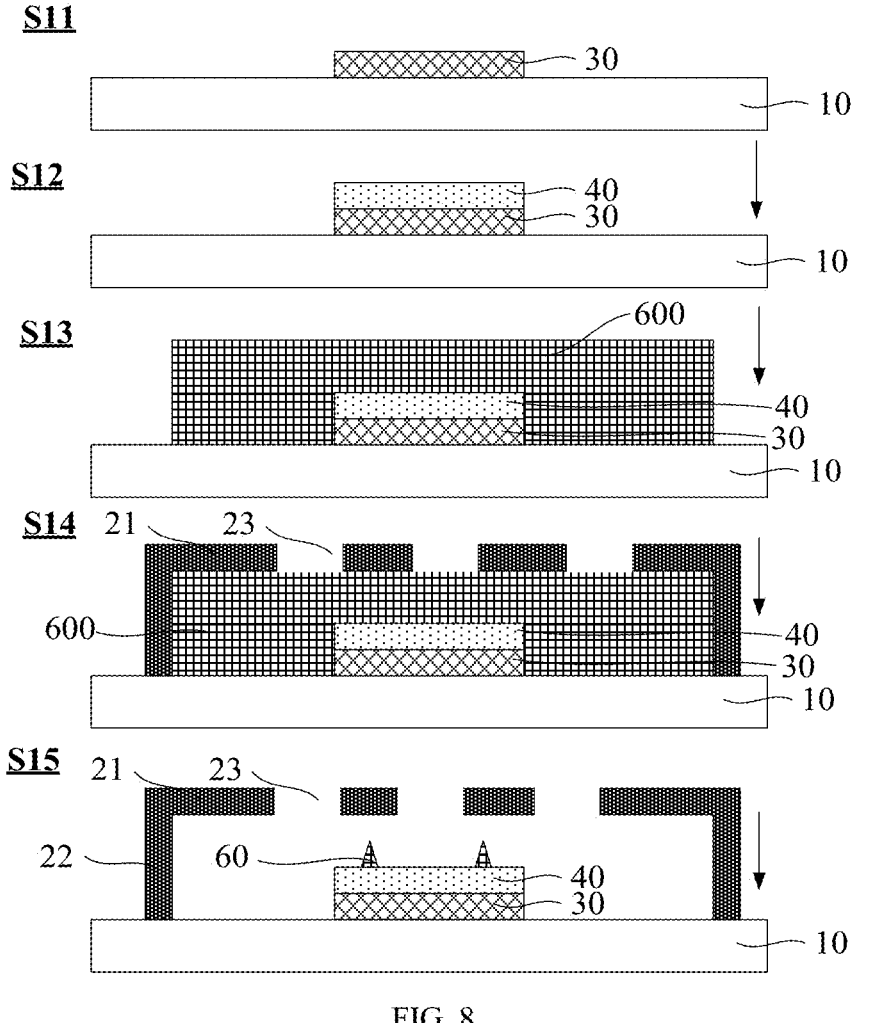
FIG. 8 is a flow chart of manufacturing an MEMS device as a switching device in a first example of an embodiment of the present disclosure.

FIG. 8 is a flow chart of manufacturing an MEMS device as a switching device in a first example of an embodiment of the present disclosure. As shown in FIG. 8, the following steps may be specifically used for manufacturing the MEMS device:

S11, forming a driving electrode 30 on a first dielectric substrate 10.

Specifically, a pattern including the driving electrode 30 may be formed through a patterning process in step S11.

S12, forming an interlayer insulating layer 40 on a side of the driving electrode 30 away from the first dielectric substrate 10.

S13, forming a sacrificial layer 600 on a side of the interlayer insulating layer 40 away from the first dielectric substrate 10.

The sacrificial layer 600 is made of an inorganic material, such as silicon nitride.

S14, forming a film-bridge 20 on a side of the sacrificial layer 600 away from the first dielectric substrate 10, a bridge floor structure 21 of the film-bridge 20 has at least one first opening 23 therein.

The first openings 23 are arranged as shown in FIG. 7.

S15, performing a dry etching on the sacrificial layer 600 to form at least one protruding structure 60 on the first dielectric substrate 10. There is a distance between the at least one protruding structure 60 and the bridge floor structure 21.

In some examples, the step S15 may specifically include performing a precisely controlled etching on the sacrificial layer 600 under the film-bridge 20 by using reactive ion etching (RIE), and by reasonably controlling a gas atmosphere (a lateral etching strength), a pressure, a power (an etching rate), etching time or the like, to form the at least one protruding structure 60 on the first dielectric substrate 10.

FIG. 9 is a cross-sectional view of an MEMS device with a protruding structure 60 perpendicular to a first dielectric substrate 10 in a first example of an embodiment of the present disclosure. As shown in FIG. 9, the sacrificial layer 600 is made of the inorganic material, the sacrificial layer 600 is etched through the plurality of first opening 23 by a dry etching process with an etching rate being anisotropic, and the first openings 23 are uniformly distributed, so that the shape of the cross section of each formed protruding structure 60 perpendicular to the first dielectric substrate 10 is an isosceles triangle.

In summary, the at least one protruding structure 60 may be formed above the first dielectric substrate 10 through the process, and can effectively reduce a contact area between the bridge floor structure 21 of the MEMS device and the layer on the first dielectric substrate 10 or the first dielectric substrate 10, and thus prevent the bridge floor structure 21 from adhering to the layers on the first dielectric substrate 10 or the first dielectric substrate 10. The openings in the same first opening group 230 have a same size and a distance between any two adjacent openings in the same first opening group 230 is constant, so that the shape of the cross section of the protruding structure 60 perpendicular to the first dielectric substrate 10 is an isosceles triangle, i.e., a=b, as shown in FIG. 9, and the base angle $\varphi$ is closely related to the size and the material of each first opening 23.

Similarly, FIG. 10 is a schematic diagram of an MEMS device as a vibrating device in a first example of an embodiment of the present disclosure. As shown in FIG. 10, when the MEMS device is applied to a vibrating device, the first component 100 serves as the vibrating diaphragm 50.

The first dielectric substrate 10 is formed with a first groove portion therein, and a portion of the first component 100 corresponding to the first groove portion serves as the first portion of the first component 100. The first component 100 includes an elastic layer 51, a first electrode layer 52, a piezoelectric layer 53 and a second electrode layer 54 which are arranged in sequence along a direction away from the first dielectric substrate 10. At this time, the plurality of first openings 23 penetrates the elastic layer 51, the first electrode layer 52, the piezoelectric layer 53, and the second electrode layer 54. FIG. 11 is a top view of a first component 100 of an MEMS device as a vibrating device in a first example of an embodiment of the present disclosure. As shown in FIG. 11, when the first member 100 has a circular contour, each first opening 23 is circular, and the circular first openings 23 are uniformly arranged. At this time, the at least one protruding structure 60 formed by etching the sacrificial layer 600 through the first openings 23 is the same as the protruding structure 60 described above, and is located in the first groove portion of the first dielectric substrate 10. For the vibrating diaphragm 50 with a larger area, the proper first openings 23 are selected to form the at least one protruding structure 60 with a corresponding size, so that the failure caused by the adhesion of the first component and layers on the first dielectric substrate can be effectively reduced in a process of forming the vibrating diaphragm 50, such the adhesion failure caused by an abnormal displacement due to non-linear excitation in operation can be improved, which has an important significance.

Figures 12, 13, 14:
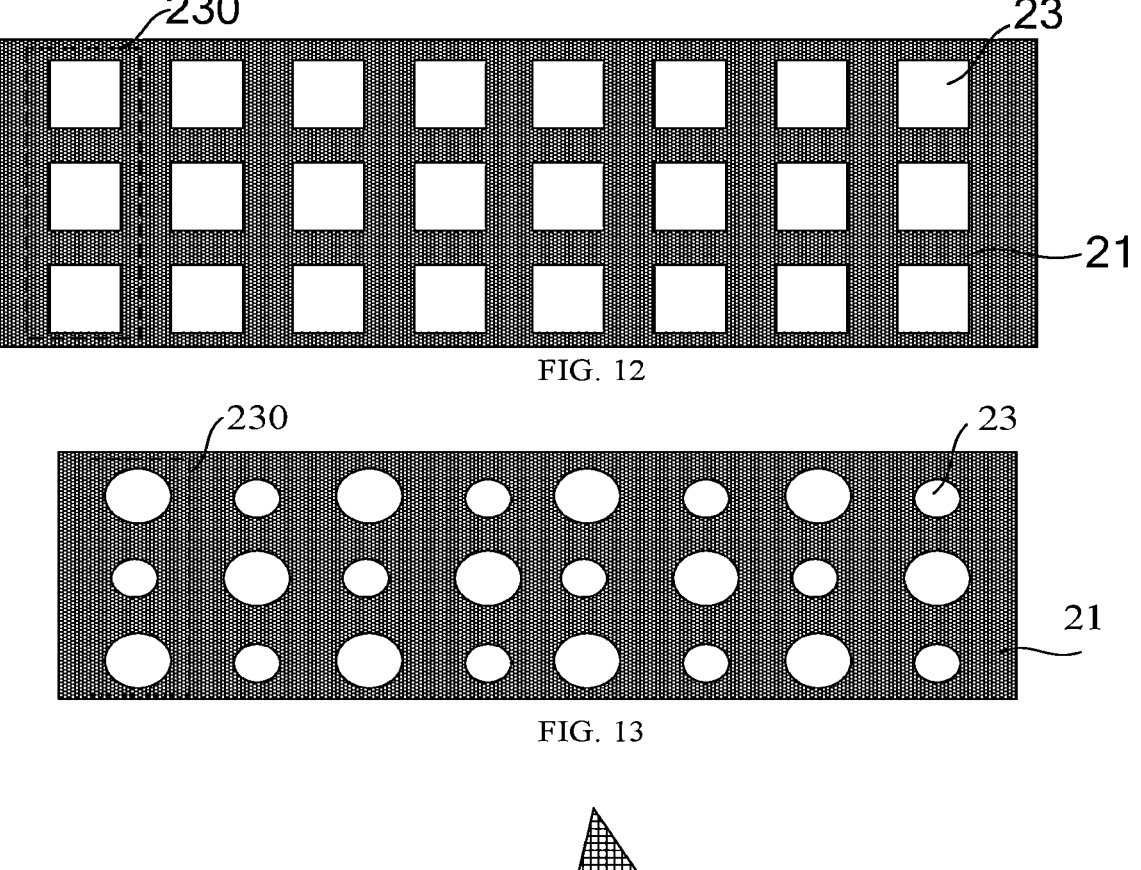
FIG. 12 is a top view of a first component of an MEMS device as a switching device in a second example of an embodiment of the present disclosure.
FIG. 13 is a top view of a first component of an MEMS device as a switching device in a third example of an embodiment of the present disclosure.
FIG. 14 is a cross-sectional view of an MEMS device with a protruding structure perpendicular to a first dielectric substrate in a third example of an embodiment of the present disclosure.

A second example is as follows: FIG. 12 is a top view of a first component 100 of an MEMS device as a switching device in a second example of an embodiment of the present disclosure. As shown in FIG. 12, the MEMS device is an MEMS switch, and, in this second example, has substantially the same as that in the first example except that the shape of each first opening 23 is square. The arrangement of the first openings 23 is the same as that in the first example. The material of the sacrificial layer 600 for forming the at least one protruding structure 60 is also the inorganic material. The shape of each first opening 23 is changed compared to that in the first example, so that the formed at least one protruding structure 60 is also changed. When each first opening 23 is circular, the shape of each formed protruding structure 60 is conical or circular truncated cone. When each first opening 23 is square, the shape of each formed protruding structure 60 is a pyramid with a corner angle on the sidewall.

Alternatively, the shape of each first opening 23 may be a polygon such as a triangle or a hexagon. Correspondingly, the shape of each protruding structure 60 formed by using the sacrificial layer 600 is a cone, a triangular pyramid, a rectangular pyramid, a polygonal pyramid, or various types of circular truncated cones, truncated pyramids, or the like, which is not further enumerated here.

A third example is as follows: FIG. 13 is a top view of a first component 100 of an MEMS device as a switching device in a third example of an embodiment of the present disclosure. As shown in FIG. 13, the MEMS device is an MEMS switch, and, in this example, has substantially the same as that in the first example except that the sizes of any two adjacent first openings 23 in the same first opening group 230 are different from each other, that is, any two adjacent circular first openings 23 in the first opening group 230 have different radii. The sizes of any two adjacent first openings 23 in the same first opening group 230 are different from each other, so that the shape of the at least one protruding structure 60 formed by etching the sacrificial layer 600 under the film-bridge 20 through the plurality of first openings 23 is different from that in the first example. In the first example, the shape of the cross section of each protruding structure 60 formed by dry etching perpendicular to the first dielectric substrate 10 is an isosceles triangle because the first openings 23 have the same size. However, in this example, because the first openings 23 adjacently disposed have different sizes, the shape of the cross section of each protruding structure 60 formed by dry etching perpendicular to the first dielectric substrate 10 is a triangle, but the triangle has different side lengths. FIG. 14 is a cross-sectional view of an MEMS device with a protruding structure 60 perpendicular to a first dielectric substrate 10 in a third example of an embodiment of the present disclosure. As shown in FIG. 14, in particular, a portion below the first opening 23 with a small radius has a weaker lateral etching than that below the first opening 23 with a large radius, so that a slope angle φ at the portion below the first opening 23 with a small radius is larger, thereby changing a relative relationship between lengths of the sides a and b of the cross section of each protruding structure 60 perpendicular to the first dielectric substrate 10, and realizing the different structural changes. In particular, in practice, the distribution of the first openings 23 having different sizes can be controlled to control the position of the at least one protruding structure 60, particularly the position of support points (vertices) of the at least one protruding structure 60.

Figures 15, 16:
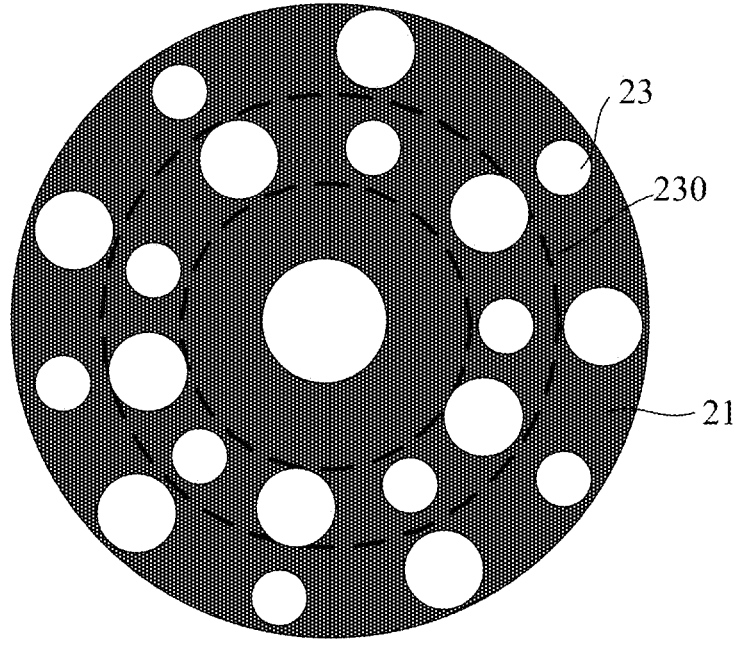
FIG. 15 is a top view of a first component of an MEMS device as a vibrating device in a third example of an embodiment of the present disclosure.
FIG. 16 is a top view of a first component of an MEMS device as a switching device in a fourth example of an embodiment of the present disclosure.

Similarly, FIG. 15 is a top view of a first component 100 of an MEMS device as a vibrating device in a third example of an embodiment of the present disclosure. As shown in FIG. 15, when the MEMS device is applied to the vibrating device, the first component 100 serves as the vibrating diaphragm 50, which is similar to the vibrating diaphragm 50 in the first example, except that the sizes of the adjacent first openings 23 are different from each other. For example: the plurality of first openings 23 are divided into a plurality of first opening groups 230 arranged in nested rings; the first openings 23 in each first opening group 230 are arranged along a circumferential direction of the first opening group 230, and the sizes of the adjacent first openings 23 are different from each other. Alternatively, one first opening 23 may also be provided in an area defined by the first opening group in a direction from a center to an edge of the first component 100. At this time, because the sizes of the first openings 23 adjacently disposed are different from each other, the cross section of the at least one protruding structure 60 formed by dry etching perpendicular to the first dielectric substrate 10 is also triangular, but the triangle has different side lengths. That is, the protruding structure 60 has the same shape as the protruding structure 60 in the MEMS switch described above.

A fourth example is as follows: FIG. 16 is a top view of a first component 100 of an MEMS device as a switching device in a fourth example of an embodiment of the present disclosure. As shown in FIG. 16, the MEMS device is an MEMS switch, and, in this example, has substantially the same as that in the third example except that the sizes of the first openings 23 in the same first opening group 230 are equal to each other, and the size of each first opening 23 in a first opening group 230 is different from that of each first opening 23 in an adjacent first opening group 230. That is, the first openings 23 in the bridge floor structure 21 have a non-uniform opening design. Because the sizes of the first openings 23 adjacently disposed are different from each other, the cross section of the at least one protruding structure 60 formed by dry etching perpendicular to the first dielectric substrate 10 is also triangular, but the triangle has different side lengths. That is, some formed protruding structures 60 are the same as in the third example.

Figure 17:
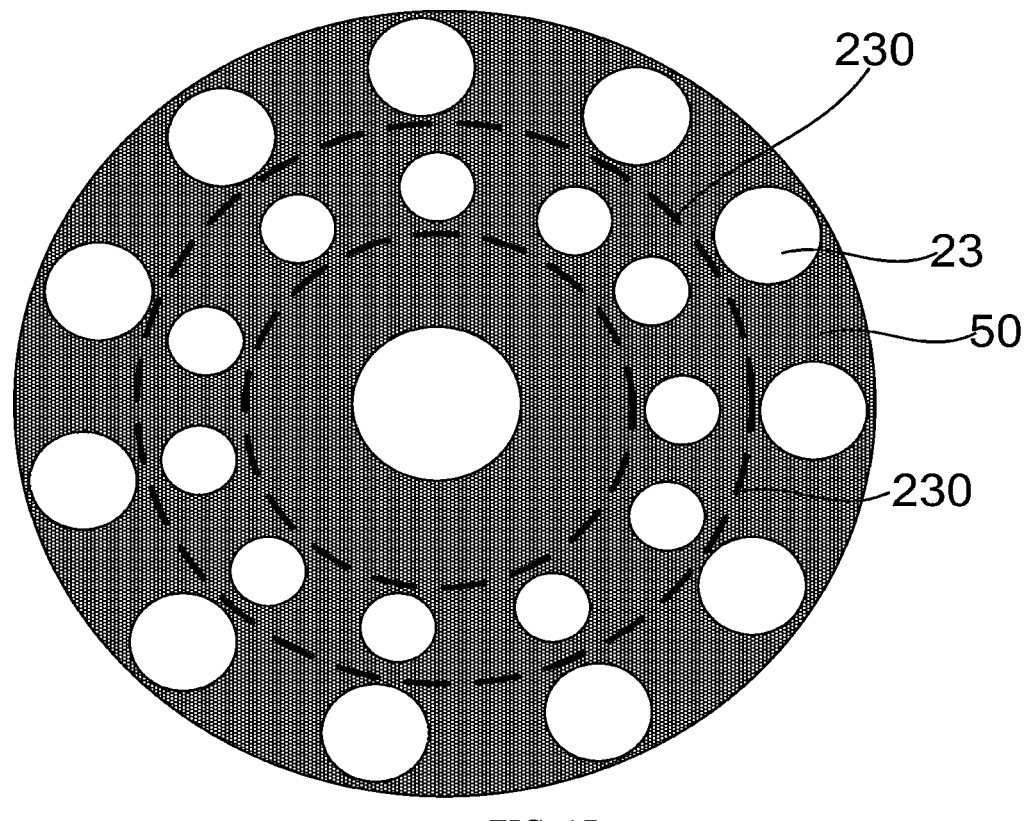
FIG. 17 is a top view of a first component of an MEMS device as a vibrating device in a fourth example of an embodiment of the present disclosure.

Similarly, FIG. 17 is a top view of a first component 100 of an MEMS device as a vibrating device in a fourth example of an embodiment of the present disclosure. As shown in FIG. 17, when the MEMS device is applied to the vibrating device, the first component 100 serves as the vibrating diaphragm 50, which is similar to the vibrating diaphragm 50 in the first example, except that the sizes of the adjacent first openings 23 are different from each other. For example: the plurality of first openings 23 are divided into a plurality of first opening groups 230 arranged in nested rings; the first openings 23 in each first opening group 230 are arranged along a circumferential direction of the first opening group 230, and the sizes of the first openings 23 in a same first opening group 230 are equal to each other; the size of each first opening 23 in a first opening group 230 is different from that of each first opening 23 in an adjacent first opening group 230. Alternatively, one first opening 23 may also be provided in an area defined by the first opening group in a direction from a center to an edge of the first component 100. At this time, because the sizes of the first openings 23 adjacently disposed are different from each other, the cross section of the at least one protruding structure 60 formed by dry etching perpendicular to the first dielectric substrate 10 is also triangular, but the triangle has different side lengths. That is, the protruding structure 60 has the same shape as the protruding structure 60 in the MEMS switch described above.

Figure 18:
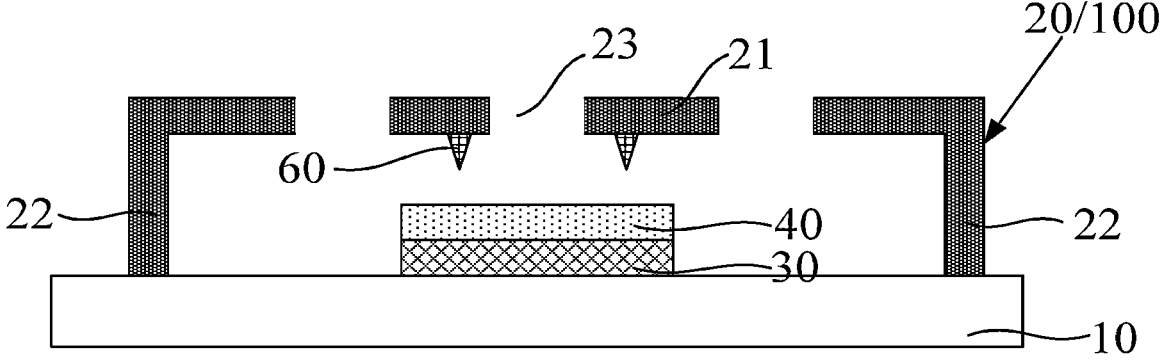
FIG. 18 is a schematic diagram of an MEMS device as a switching device in a fifth example of an embodiment of the present disclosure.
Figure 19:
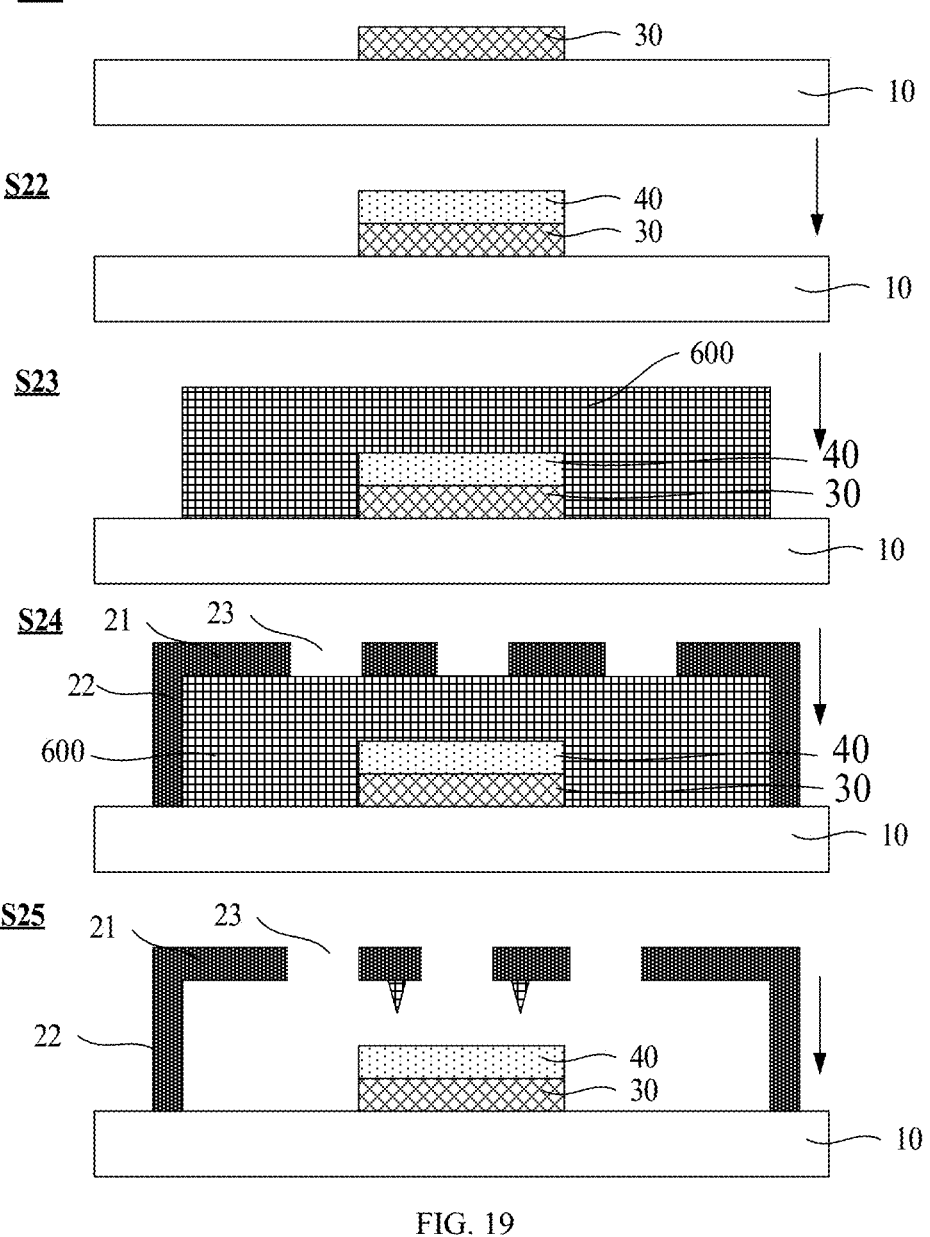
FIG. 19 is a flow chart of manufacturing an MEMS device as a switching device in a fifth example of an embodiment of the present disclosure.

A fifth example is as follows: FIG. 18 is a schematic diagram of an MEMS device as a switching device in a fifth example of an embodiment of the present disclosure. As shown in FIG. 18, the structure in this example is substantially the same as that in the first example except that the sacrificial layer 600 for forming the at least one protruding structure 60 is made of an organic material. The at least one protruding structure 60 formed by etching the sacrificial layer 600 through the plurality of first openings 23 is located on a side of the bridge floor structure 21 close to the first dielectric substrate 10 and is in contact with the bridge floor structure 21. A method for manufacturing the MEMS device having such a structure is described below. FIG. 19 is a flow chart of manufacturing an MEMS device as a switching device in a fifth example of an embodiment of the present disclosure. As shown in FIG. 19, the method includes:

S21, forming a driving electrode 30 on a first dielectric substrate 10.

Specifically, a pattern including the driving electrode 30 may be formed through a patterning process in step S21.

S22, forming an interlayer insulating layer 40 on a side of the driving electrode 30 away from the first dielectric substrate 10.

S23, forming a sacrificial layer 600 on a side of the interlayer insulating layer 40 away from the first dielectric substrate 10.

The sacrificial layer 600 is made of an organic material, such as a resin material (resin, PR, OC or the like).

S24, forming a film-bridge 20 on a side of the sacrificial layer 600 away from the first dielectric substrate 10, a bridge floor structure 21 of the film-bridge 20 has at least one first opening 23 therein.

The first openings 23 are arranged as shown in FIG. 7.

S25, performing a dry etching process on the sacrificial layer 600 to form at least one protruding structure 60 on the bridge floor structure 21. There is a distance between the at least one protruding structure 60 and the first dielectric substrate 10.

In some examples, the step S25 may specifically include performing a precisely controlled etching on the sacrificial layer 600 under the film-bridge 20 by using reactive ion etching (RIE), and by reasonably controlling a gas atmosphere (a lateral etching strength), a pressure, a power (an etching rate), etching time or the like, to form the at least one protruding structure 60 on the bridge floor structure 21.

The sacrificial layer 600 is made of the organic material, the sacrificial layer 600 is etched through the plurality of first opening 23 by a dry etching process with an etching rate being anisotropic, and the first openings 23 are uniformly distributed, so that the shape of the cross section of each formed protruding structure 60 perpendicular to the first dielectric substrate 10 is an isosceles triangle.

Figure 20:
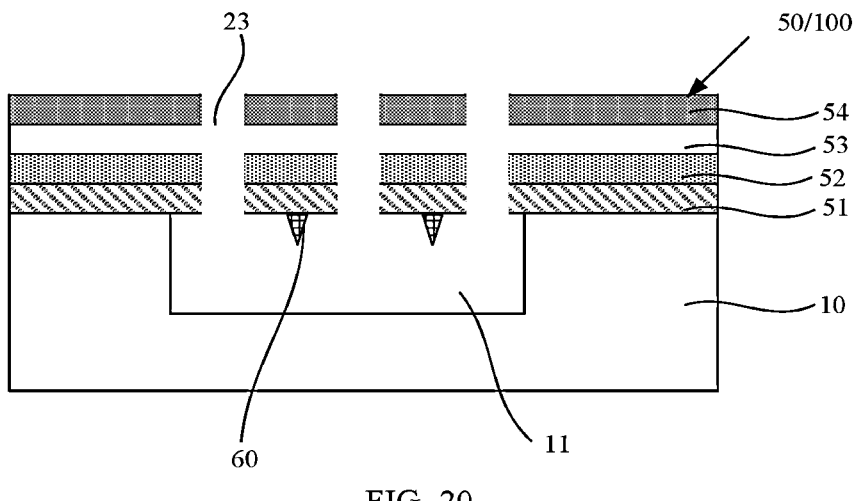
FIG. 20 is a schematic diagram of an MEMS device as a vibrating device in a fifth example of an embodiment of the present disclosure.

Similarly, FIG. 20 is a schematic diagram of an MEMS device as a vibrating device in a fifth example of an embodiment of the present disclosure. As shown in FIG. 20, when the MEMS device is applied to a vibrating device, compared with the vibrating device in the first example, the sacrificial layer 600 for forming the at least one protruding structure 60 is made of the organic material, the at least one protruding structure 60 is disposed on the vibrating diaphragm 50, and the rest of the structure of the vibrating device are the same as that in the first example, and the description thereof is not repeated here.

A sixth example is as follows: the structure in this example is substantially the same as that in the fifth example, except that the first openings 23 in the film-bridge 20 are non-uniform first openings 23 (that is, first openings 23 having different sizes). For example: the arrangement of the first openings 23 in this example is the same as that in the third or fourth example. At this time, the sacrificial layer 600 is dry etched through the first openings 23, and the formed at least one protruding structure 60 is located on the bridge floor structure 21, and the shape of each protruding structure 60 is a triangle with different side lengths. Specifically, a portion below the first opening 23 with a small radius has a weaker lateral etching than that below the first opening 23 with a large radius, so that a slope angle φ at the portion below the first opening 23 with a small radius is larger, thereby changing a relative relationship between lengths of the sides a and b of the cross section of each protruding structure 60 perpendicular to the first dielectric substrate 10, and realizing the different structural changes. In particular, in practice, the distribution of the first openings 23 having different sizes can be controlled to control the position of the at least one protruding structure 60, particularly the position of support points (vertices) of the at least one protruding structure 60.

Similarly, when the MEMS device is applied to a vibrating device, compared with the vibrating device in the third and fourth examples, the sacrificial layer 600 for forming the at least one protruding structure 60 is made of the organic material, the at least one protruding structure 60 is disposed on the vibrating diaphragm 50, and the rest of the structure of the vibrating device are the same as that in the third and fourth examples, and the description thereof is not repeated here.

Above, only some exemplary structures and a corresponding method for manufacturing an MEMS device are given, which should not be construed as limiting the scope of the embodiments of the present disclosure.

The embodiment of the present disclosure further provides an electronic device, which includes the above MEMS device. The electronic device includes, but is not limited to, a phase shifter, an accelerometer, an angular velocity meter, a tiny microphone, a micro electro mechanical interference display, a micro-electro-mechanical capacitive ultrasonic transducer, a micro mirror, or the like.

It should be understood that, the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An MEMS device, comprising: a first dielectric substrate and a first component on the first dielectric substrate;
   wherein the first component and the first dielectric substrate enclose a movable space;
   the first component has a first portion corresponding to the movable space;
   wherein the first portion has at least one first opening, and at least one protruding structure is on a side of the first portion close to the first dielectric substrate;
   orthographic projections of the at least one protruding structure and the at least one first opening on the first dielectric substrate do not overlap with each other; and
   a thickness of each protruding structure is smaller than a height of the movable space,
   wherein the first component comprises a bridge floor structure and at least one connecting arm;
   the bridge floor structure is fixed to the first dielectric substrate through the at least one connecting arm, and the bridge floor structure is used as the first portion;
   the MEMS device further comprises a driving electrode on the first dielectric substrate and an interlayer insulating layer covering the driving electrode;
   the bridge floor structure spans across the driving electrode; and
   there is a distance between the bridge floor structure and the interlayer insulating layer covering the driving electrode; and
   wherein the at least one protruding structure is on the interlayer insulating layer which is arranged on the first dielectric substrate, and is in direct contact with the interlayer insulating layer; and there is a distance between an end of the at least one protruding structure facing the bridge floor structure and the bridge floor structure to form a gap between the end of the at least one protruding structure and the bridge floor structure, which is within the movable space.

2. The MEMS device of claim 1, wherein the first portion has a plurality of first openings, which are divided into a plurality of first opening groups arranged side by side along a first direction;
   first openings in each first opening group are arranged side by side along a second direction; and
   sizes of the first openings in the same first opening group are equal to each other.

3. The MEMS device of claim 1, wherein the first portion has a plurality of first openings, which are divided into a plurality of first opening groups arranged side by side along a first direction;
   first openings in each first opening group are arranged side by side along a second direction; and
   sizes of any two adjacent first openings in the same first opening group are different from each other, and a cross section of each of the at least one protruding structure in a direction perpendicular to the first dielectric substrate has a larger side length closer to a first opening with a larger size of the two adjacent first openings and has a smaller side length closer to a first opening with a smaller size of the two adjacent first openings.

4. The MEMS device of claim 1, wherein the first portion comprises a plurality of first opening groups arranged in nested rings;

first openings in each first opening group are sequentially arranged along a circumferential direction of the first opening group, and sizes of the first openings in the same first opening group are equal to each other.

5. The MEMS device of claim 4, wherein a size of each first opening in a first opening group is different from that of each first opening in an adjacent first opening group; and a cross section of each of the at least one protruding structure in a direction perpendicular to the first dielectric substrate has a larger side length closer to a first opening with a larger size of any two adjacent first openings with different sizes and has a smaller side length closer to a first opening with a smaller size of the two adjacent first openings with different sizes.

6. The MEMS device of claim 1, wherein the first portion comprises a plurality of first opening groups arranged in nested rings;

first openings in each first opening group are sequentially arranged along a circumferential direction of the first opening group; and sizes of any two adjacent first openings in the same first opening group are different from each other, and a cross section of each of the at least one protruding structure in a direction perpendicular to the first dielectric substrate has a larger side length closer to a first opening with a larger size of the two adjacent first openings and has a smaller side length closer to a first opening with a smaller size of the two adjacent first openings.

7. The MEMS device of claim 1, wherein a shape of the at least one protruding structure comprises one or more of a pyramid, a cone, a truncated pyramid, and a circular truncated cone, or a combination thereof.

8. The MEMS device of claim 1, wherein a shape of the at least one first opening comprises one or more of a circle, an ellipse and a polygon, or a combination thereof.

9. The MEMS device of claim 1, wherein a material of the at least one protruding structure comprises an inorganic material.

10. The MEMS device of claim 1, wherein the at least one protruding structure is on the first portion; and there is a distance between the at least one protruding structure and the first dielectric substrate.

11. The MEMS device of claim 10, wherein a material of the at least one protruding structure comprises an organic material.

12. The MEMS device of claim 1, wherein the first dielectric substrate has a first groove portion therein;

the first portion and the first groove portion form the movable space; and the first component comprises an elastic layer, a first electrode layer, a piezoelectric layer and a second electrode layer which are sequentially arranged on the first dielectric substrate.

13. A method for manufacturing the MEMS device of claim 1, comprising:

forming a sacrificial layer on a side of the first dielectric substrate;

forming the first component on a side of the sacrificial layer away from the first dielectric substrate, wherein the first portion of the first component is provided with at least one first opening therein; the first component and the first dielectric substrate enclose the movable space; and etching the sacrificial layer by a dry etching process to form the at least one protruding structure on a side of the first portion close to the first dielectric substrate so that the orthographic projections of the at least one protruding structure and the at least one first opening on the first dielectric substrate do not overlap with each other, and the thickness of each protruding structure is smaller than the height of the movable space.

14. An electronic device, comprising the MEMS device of claim 1.

* * * * *